(12) United States Patent
Wu et al.

(10) Patent No.: US 9,515,191 B2
(45) Date of Patent: Dec. 6, 2016

(54) THIN-FILM FIELD EFFECT TRANSISTOR, DRIVING METHOD THEREOF, ARRAY SUBSTRATE, DISPLAY DEVICE, AND ELECTRONIC PRODUCT

(71) Applicants: CHENGDU BOE OPTOELECTRONICS TECHNOLOGY CO., LTD., Chengdu, Sichuan Province (CN); BOE TECHNOLOGY GROUP CO., LTD., Beijing (CN)

(72) Inventors: Bo Wu, Beijing (CN); Xiaojing Qi, Beijing (CN)

(73) Assignees: CHENGDU BOE OPTOELECTRONICS TECHNOLOGY CO., LTD. (CN); BOE TECHNOLOGY GROUP CO., LTD. (CN)

( * ) Notice: Subject to any disclaimer, the term of this patent is extended or adjusted under 35 U.S.C. 154(b) by 113 days.

(21) Appl. No.: 14/241,558

(22) PCT Filed: Aug. 5, 2013

(86) PCT No.: PCT/CN2013/080789
§ 371 (c)(1),
(2) Date: Feb. 27, 2014

(87) PCT Pub. No.: WO2014/194558
PCT Pub. Date: Dec. 11, 2014

(65) Prior Publication Data
US 2015/0311344 A1    Oct. 29, 2015

(30) Foreign Application Priority Data

Jun. 7, 2013  (CN) .......................... 2013 1 0226377

(51) Int. Cl.
*H01L 27/14* (2006.01)
*H01L 29/786* (2006.01)
*H01L 27/12* (2006.01)

(52) U.S. Cl.
CPC ....... *H01L 29/7866* (2013.01); *H01L 27/1218* (2013.01); *H01L 29/78648* (2013.01)

(58) Field of Classification Search
CPC ....................... H01L 29/7866; H01L 27/1218
See application file for complete search history.

(56) References Cited

U.S. PATENT DOCUMENTS 5,831,707 A * 11/1998 Ota ................... G02F 1/134363
                                                                349/141
7,679,699 B2    3/2010  Ahn et al.
(Continued)

FOREIGN PATENT DOCUMENTS

| CN | 1480914 A | 3/2004 |
| CN | 1797151 A | 7/2006 |

(Continued)

OTHER PUBLICATIONS

PCT/CN2013/080789 Search Report and Written Opinion; dated: Mar. 20, 2014; 12 pages.

(Continued)

Primary Examiner — Shaun Campbell
(74) Attorney, Agent, or Firm — Brooks Kushman P.C.

(57) ABSTRACT

The disclosure provides a thin film field effect transistor, a driving method thereof, an array substrate, a display device and an electronic product. The thin film field effect transistor comprises a gate metal layer and a semiconductor layer, and further comprises a guide layer, wherein when an electric field is formed between the gate metal layer and the semiconductor layer, an electric field is also formed between the guide layer and the gate metal layer, the semiconductor layer accumulates electrons or holes to reinforce the electric field between the gate metal layer and the semiconductor layer by utilizing the electric field between the guide layer and the gate metal layer. Through the guide layer, it is able to affect the current characteristics of the thin film field effect transistor by improving its structure, thereby to reduce a threshold voltage and a leakage current.

17 Claims, 4 Drawing Sheets

(56) References Cited

U.S. PATENT DOCUMENTS

| | | | |
|---|---|---|---|
| 2003/0038288 A1 | 2/2003 | Suzuki et al. | |
| 2003/0075733 A1* | 4/2003 | Yamazaki | H01L 21/2026 257/200 |
| 2005/0282317 A1* | 12/2005 | Ikeda | H01L 29/78648 438/149 |
| 2011/0175674 A1 | 7/2011 | Shimizu et al. | |

FOREIGN PATENT DOCUMENTS

| | | |
|---|---|---|
| CN | 101595567 A | 12/2009 |
| CN | 10269362 A | 3/2013 |
| JP | H04334061 A | 11/1992 |
| JP | H08107212 A | 4/1996 |
| JP | 2006165233 A | 6/2006 |

OTHER PUBLICATIONS

Chinese Office Action of corresponding CN 201310226377.4 dated Apr. 3, 2015; 7 pages.

Chinese Office Action of corresponding CN 201310226377.4 dated Apr. 3, 2015; 4 pages [English Tranlsation].

Chinese Second Office Action Dated Sep. 30, 2015, Application No. 201310226377.4, 4 Pages.

English Translation of PCT Written Opinion of the International Searching Authority, Application PCT/CN2013/080789, 3 Pages.

Chinese Third Office Action Dated Apr. 1, 2016, Application No. 201310226377.4, 5 Pages.

Chinese Office Action for Chinese Application No. 201310226377.4, dated Sep. 28, 2016, 5 Pages.

* cited by examiner

THIN-FILM FIELD EFFECT TRANSISTOR, DRIVING METHOD THEREOF, ARRAY SUBSTRATE, DISPLAY DEVICE, AND ELECTRONIC PRODUCT

CROSS-REFERENCE TO RELATED APPLICATION

This application is the U.S. national phase of PCT Application No. PCT/CN2013/080789 filed on Aug. 5, 2013, which claims priority to Chinese Patent Application No. 201310226377.4 filed on Jun. 7, 2013, the disclosures of which are incorporated in their entirety by reference herein.

TECHNICAL FIELD

The present invention relates to the field of display technology, in particular to a thin film field effect transistor, a driving method thereof, an array substrate, a display device, and an electronic product.

BACKGROUND

In a liquid crystal display technology, existing thin film field effect transistors may be of several types, including low temperature poly-silicon (LTPS) transistor, metal-oxide-semiconductor field effect transistor (MOSFET) and amorphous-silicon (a-Si) thin film transistor. During the design of these thin film field effect transistors, a non-uniform driving current is generated by a pixel circuit of a display due to the existence of a threshold voltage and a leakage current, and this poses a challenge to the uniformity of brightness. Hence, how to reduce or compensate for the threshold voltage becomes a key point for designing a pixel driving circuit on a display panel.

Especially for an LTPS technology, as a process for manufacturing a new-generation thin film transistor-liquid crystal display (TFT-LCD) and an important branch of polysilicon technology, it is more urgent to address the above problem due to its characteristics. For the LCD, the LTPS technology can remarkably improve the carrier mobility, so it is able to miniaturize TFT elements, improve an aperture ratio of the panel, increase the brightness and reduce the power consumption. In addition, a glass substrate may be used during the low-temperature manufacturing process, so it is able to remarkably reduce the production cost. As a result, the LTPS technology has been widely used in the manufacturing of the modern LCD.

FIG. 1 shows drain current-gate voltage characteristic curves for a typical N-type MOSFET, a LTPS TFT and an a-Si TFT. The a-Si TFT has a low leakage current, but its on-state current is not high enough due to the low carrier mobility, and obviously an on-state current of the LTPS TFT is much higher than that of the a-Si TFT. When in a cut-off state, the leakage current of the LTPS TFT is increased along with an increase in the negative gate voltage, and there is still a way of electric leakage for the pixel in the cut-off state, resulting in a decrease in the voltage of a storage capacitor in the pixel driving circuit of the display. As a result, in the design of the pixel circuit using the LTPS technology, various methods are used to reduce the leakage current.

However, in the prior art, there is no scheme capable of improving the structure of the thin film field effect transistor so as to affect its current characteristics, thereby to reduce the threshold voltage and the leakage current.

SUMMARY

An object of an embodiment of the present invention is to provide a thin film field effect transistor, an driving method thereof, an array substrate, a display device and an electronic product, so as to affect the current characteristics of the thin film field effect transistor by improving its structure, thereby to reduce a threshold voltage and a leakage current.

In one aspect, an embodiment of the present invention provides a thin film field effect transistor comprising a gate metal layer and a semiconductor layer. The thin film field effect transistor further comprises a guide layer, wherein when an electric field is formed between the gate metal layer and the semiconductor layer, an electric field is also formed between the guide layer and the gate metal layer, the semiconductor layer accumulates electrons or holes to reinforce the electric field between the gate metal layer and the semiconductor layer by utilizing the electric field between the guide layer and the gate metal layer.

Preferably, the electric field between the gate metal layer and the guide layer is in a direction identical to the electric field between the gate metal layer and the semiconductor layer.

Preferably, when an on-state operating voltage is applied to the gate metal layer, a first voltage is applied to the guide layer, and the electric field between the gate metal layer and the guide layer is in a direction identical to the electric field between the gate metal layer and the semiconductor layer; when an off-state operating voltage is applied to the gate metal layer, a second voltage is applied to the guide layer, and the electric field between the gate metal layer and the guide layer is in a direction identical to the electric field between the gate metal layer and the semiconductor layer.

Preferably, the thin film field effect transistor is an N-type transistor, the on-state operating voltage is a positive voltage, the off-state operating voltage is a negative voltage, and either of the first voltage and the second voltage is of a value between the on-state operating voltage and the off-state operating voltage.

Preferably, the thin film field effect transistor is a P-type transistor, the on-state operating voltage is a negative voltage, the off-state operating voltage is a positive voltage, and either of the first voltage and the second voltage is of a value between the on-state, operating voltage and the off-state, operating voltage.

Preferably, the first voltage is equal to the second voltage, e.g., they are both zero.

Preferably, the semiconductor layer is provided between the gate metal layer and the guide layer.

Preferably, a first insulating layer is provided between the semiconductor layer and the gate metal layer, and a second insulating layer is provided between the semiconductor layer and the guide layer.

Preferably, the guide layer is made of a conductive material.

In another aspect, an embodiment of the present invention provides a method for driving a thin film field effect transistor comprising a gate metal layer, a semiconductor layer and a guide layer, the method comprising: when an on-state operating voltage or an off-state operating voltage is applied to the gate metal layer and an electric field is formed between the gate metal layer and the semiconductor layer, applying a predetermined voltage to the guide layer such that an electric field is also formed between the guide layer and the gate metal layer, the semiconductor layer accumulates electrons or holes to reinforce the electric field between the gate metal layer and the semiconductor layer by utilizing the electric field between the guide layer and the gate metal layer.

In yet another aspect, an embodiment of the present invention provides an array substrate on which the above-mentioned thin film field effect transistor is provided.

Preferably, the array substrate comprises a shielding metal layer formed as a guide layer.

Preferably, the shielding metal layer is grounded.

In yet another aspect, an embodiment of the present invention provides a display device comprising the above-mentioned array substrate.

In yet another aspect, an embodiment of the present invention provides an electronic product comprising the above-mentioned display device.

The above technical solutions according to an embodiment of the present invention have the following advantageous effect. The guide layer is provided, and through the electric field between the guide layer and the gate metal layer when the thin film field effect transistor is in an on state and an off state respectively, it is able to reduce a threshold voltage, increase a current when the transistor is turned on and reduce a leakage current, thereby to affect the current characteristics by improving the structure of the thin film field effect transistor and increase a ratio of an on-state current to an off-state current.

DETAILED DESCRIPTION

The present invention will be described hereinafter in conjunction with the drawings.

Figure 1:
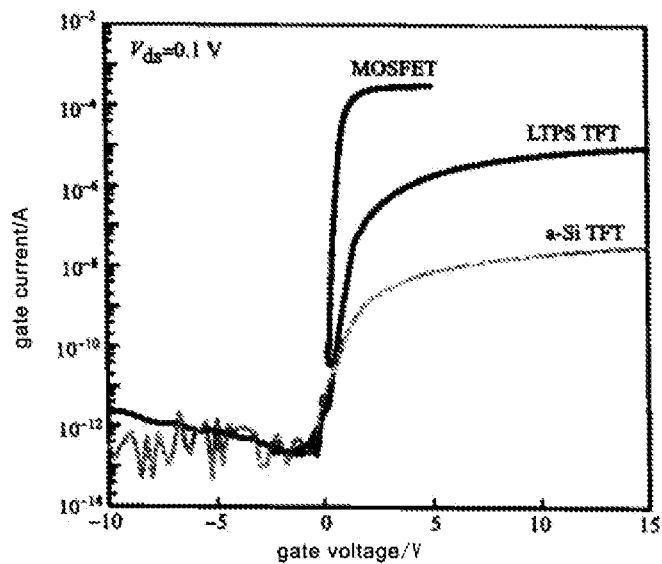
FIG. 1 is a view showing characteristic curves of thin film field effect transistors in the prior art.
Figure 2:
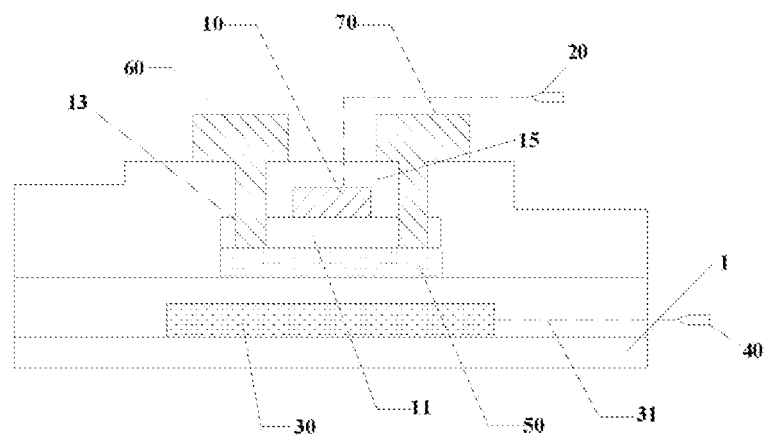
FIG. 2 is a schematic structural view showing a thin film field effect transistor according to an embodiment of the present invention.

Referring to FIG. 2, the structure according to an embodiment of the present invention is described by taking a thin film field effect transistor in which a gate metal layer is located at the top thereof as an example. The thin film field effect transistor according to an embodiment of the present invention comprises the gate metal layer 10, a source metal layer 60, a drain metal layer 70 and a semiconductor layer 50, all of which are provided on a substrate 1. The gate metal layer 10 is provided above the semiconductor layer 50. The source metal layer 60 and the drain metal layer 70 are provided at two ends of the semiconductor layer 50 respectively, and electrically connected to the semiconductor layer 50 via a via-hole 13 respectively.

A gate insulating layer 11 is provided between the semiconductor layer 50 and the gate metal layer 10. A second insulating layer 31 is provided between the semiconductor layer 50 and the guide layer 30. A protective layer 15 is provided between the source metal layer 60 and the gate metal layer 10, and between the drain metal layer 70 and the gate metal layer 10, so as to protect the gate metal layer 10 from corrosion and avoid short circuits of the source metal layer 60, the drain metal layer 70 and the gate metal layer 10 during the manufacturing process.

The via hole 13 needs to penetrate through functional layers between the source metal layer 60 and the semiconductor layer 50, and between the drain metal layer 70 and the semiconductor layer 50, so as to ensure the electrical connection of the source metal layer 60 with the semiconductor layer 50 through the via hole 13 and the electrical connection of the drain metal layer 70 with the semiconductor layer 50 through the via hole 13. For example, in this embodiment, the via hole 13 needs to penetrate through the functional layers (i.e., the protective layer 15 and the gate insulating layer 11).

The operating voltage applied to the thin film field effect transistor includes an on-state operating voltage and an off-state operating voltage. When the on-state operating voltage is applied to the gate metal layer 10, the source metal layer 60 is electrically connected to the drain metal layer 70, and when the off-state voltage is applied to the gate metal layer 10, the electrical connection between the source metal layer 60 and the drain metal layer 70 is cut off.

In an example as shown in FIG. 2, the on-state operating voltage or the off-state operating voltage is applied to the gate metal layer 10, and an electric field is formed between the gate metal layer 10 and the semiconductor layer 50. When the thin film field effect transistor is turned on or off, a predetermined voltage is applied to the guide layer 30, so that an electric field is also formed between the guide layer 30 and the gate metal layer 10. The semiconductor layer 50 accumulates electrons or holes to reinforce the electric field between the gate metal layer 10 and the semiconductor layer 50, thereby it is easy to establish the electrical connection between the source metal layer 60 and the drain metal layer 70. The guide layer 30 is added to the thin film field effect transistor, such that an electric field is formed between the guide layer 30 and the gate metal layer 10 and acts on the semiconductor layer 50, thereby it is able to reduce a threshold voltage $V_{th}$ of the thin film field effect transistor, increase a current $I_{on}$ when the transistor is turned on and reduce a leakage current $I_{off}$. As a result, it is able to affect the current characteristics by improving the structure of the thin film field effect transistor and increase a ratio of an on-state current to an off-state current.

Preferably, the electric field formed between the gate metal layer 10 and the guide layer 30 is in a direction identical to the electric field between the gate metal layer 10 and the semiconductor layer 50.

Preferably, when the on-state operating voltage is applied to the gate metal layer 10, a first voltage is applied to the guide layer 30 so that the electric field between the gate metal layer 10 and the guide layer 30 is in a direction identical to the electric field between the gate metal layer 10 and the semiconductor layer 50. When the off-state operating voltage is applied to the gate metal layer 10, a second voltage is applied to the guide layer 30 so that the electric field between the gate metal layer 10 and the guide layer 30 is in a direction identical to the electric field between the gate metal layer 10 and the semiconductor layer 50.

Different thin film field effect transistors have different on-state operating voltages and off-state operating voltages. For example, when the thin film field effect transistor has an N-type channel, the on-state operating voltage is a positive voltage and the off-state operating voltage is a negative voltage. When the on-state operating voltage is applied to the gate metal layer 10, an attractive effect is generated in the semiconductor layer 50 to form an electron channel, thereby the electrical connection is established between the source metal layer 60 and the drain metal layer 70. When the off-state operating voltage is applied to the gate metal layer 10, the electrons are repelled from the semiconductor layer 50 and the electrical connection between the source metal layer 60 and the drain metal layer 70 is cut off.

Hence, as shown in FIG. 2, the gate metal layer 10 is connected to a first voltage input terminal 20. When an input voltage applied to the gate metal layer 10 through the first voltage input terminal 20 reaches the on-state operating voltage, the electrical connection between the source metal layer 60 and the drain metal layer 70 is established, and when the input voltage applied to the gate metal layer 10 through the first voltage input terminal 20 reaches the off-state operating voltage, the electrical connection between the source metal layer 60 and the drain metal layer 70 is cut off.

In this embodiment, the guide layer 30 is disposed below the semiconductor layer 50 and connected to a second voltage input terminal 40. When the on-state operating voltage is applied to the gate metal layer 10 such that the electrical connection between the source metal layer 60 and the drain metal layer 70 is established, the first voltage is applied to the guide layer 30 through the second voltage input terminal 40, thereby the electric field formed between the gate metal layer 10 and the guide layer 30 is in a direction identical to the electric field between the gate metal layer 10 and the semiconductor layer 50. When the off-state operating voltage is applied to the gate metal layer 10 such that the electrical connection between the source metal layer 60 and the drain metal layer 70 is cut off, the second voltage is applied to the guide layer 30 through the second voltage input terminal 40, thereby the electric field formed between the gate metal layer 10 and the guide layer 30 is in a direction identical to the electric field between the gate metal layer 10 and the semiconductor layer 50.

It should be appreciated that, the positional relationship among the gate metal layer 10, the semiconductor layer 50 and the guide layer 30 of the thin film field effect transistor is not limited to the structure as shown in FIG. 2, as long as the semiconductor layer 50, when the electric field is formed between the gate metal layer 10 and the guide layer 30, accumulates the electrons or holes so as to easily establish or cut off the electrical connection between the source metal layer 60 and the drain metal layer 70.

Preferably, the semiconductor layer 50 is located between the gate metal layer 10 and the guide layer 30.

Further, a first insulating layer (i.e., the gate insulating layer 11 as mentioned above) is arranged between the semiconductor layer 50 and the gate metal layer 10, and a second insulating layer 31 is arranged between the semiconductor layer 50 and the guide layer 30. The first insulating layer 11 and the second insulating layer 31 may be made of an identical material or different materials. Of course, any other layer may also be arranged between the semiconductor layer 50 and the guide layer 30 or between the semiconductor layer 50 and the gate metal layer 10, as long as the generation of the electric field therebetween is not affected.

It should be appreciated that, in order to ensure a direct and effective influence of the electric field between the gate metal layer 10 and the guide layer 30 on the semiconductor layer 50, the semiconductor layer 50, the gate metal layer 10 and the guide layer 30 are arranged in opposite to each other (i.e., they partially or fully overlap with each other). Preferably, within a region where the semiconductor layer 50, the gate metal layer 10 and the guide layer 30 overlap with each other, the cross section area of the guide layer 30 is larger than that of the semiconductor layer 50, and the cross section area of the semiconductor layer 50 is larger than that of the gate metal layer 10 (as shown in FIG. 2).

It should be appreciated that, the above description is given by taking the thin film field effect transistor in which the gate electrode is arranged at the top thereof as an example. The positional relationship among the gate metal layer 10, the semiconductor layer 50 and the guide layer 30 of the thin film field effect transistor is not defined herein, as long as the semiconductor layer 50, when the electric field is formed between the gate metal layer 10 and the guide layer 30, accumulates the electrons or holes so as to easily establish or cut off the electrical connection between the source metal layer 60 and the drain metal layer 70.

It should be appreciated that, the guide layer 30 may be made of a conductive material, e.g., a conductor or a semiconductor. However, the material of the guide layer 30 is not defined herein, as long as the desired electric field, when the voltage is applied, may be formed between the gate metal layer 10 and the guide layer 30. Preferably, the guide layer 30 is made of a material with high conductivity, e.g., a metal or an alloy.

The guide layer 30 and the gate metal layer 10 may be made of the same material, e.g., Cu. Further, in order to avoid the influence of the guide layer 30 on the substrate 1 or to increase the adhesion between the guide layer 30 and the substrate 1, a reinforcing layer (not shown) may also be arranged between the guide layer 30 and the substrate 1. The reinforcing layer may be made of a transparent conductive material, e.g., ITO.

A person skilled in the art would know the condition of the electric field formed between the gate metal layer 10 and the semiconductor layer 50 when the thin film field effect transistor is in the on state or off state, and the details will not be described herein.

Through the above structure, when the thin film field effect transistor is in the on state or the off state, the electric field is formed between the gate metal layer 10 and the guide layer 30. If the voltage applied to the gate metal layer 10 is higher than the voltage applied to the guide layer 30, it will be known, from the principle that a movement direction of the electrons is opposite to the direction of the electric field, that in this case the electrons forming the electric field are more easily accumulated in the semiconductor layer 50 below the gate metal layer 10. If the voltage applied to the gate metal layer 10 is lower than the voltage applied to the guide layer 30, it will be known, from the principle that a movement direction of the electrons is opposite to the direction of the electric field, that in this case the holes forming the electric field are more easily accumulated in the semiconductor layer 50 below the gate metal layer 10.

When the thin film field effect transistor is in the on state, if the thin film field effect transistor is an N-type transistor, the electrons are accumulated in the semiconductor layer 50 below the gate metal layer 10 in the on state. Hence, if the voltage applied to the gate metal layer 10 is higher than the voltage applied to the guide layer 30, the electric field between the gate metal layer 10 and the semiconductor layer 50 is reinforced by means of the electric field between the gate metal layer 10 and the guide layer 30. As a result, it is able to easily accumulate the electrons below the gate metal layer 10, thereby to turn on the thin film field effect transistor in an easier manner, reduce the on-state voltage, i.e., the threshold voltage $V_{th}$, and increase the on-state current $I_{on}$. If the thin film field effect transistor is a P-type transistor, in the on state the holes are accumulated in the semiconductor layer 50 below the gate metal layer 10. Hence, if the voltage applied to the gate metal layer 10 is lower than the voltage applied to the guide layer 30, the electric field between the gate metal layer 10 and the semiconductor layer 50 is reinforced by means of the electric field between the gate metal layer 10 and the guide layer 30. As a result, it is able to easily accumulate the holes below the gate metal layer 10, thereby to turn on the thin film field effect transistor in an easier manner, reduce the on-state voltage, i.e., the threshold voltage $V_{th}$, and increase the on-state current $I_{on}$.

Similarly, in the off state, if the thin film field effect transistor is an N-type transistor, the electrons are repelled from the semiconductor layer 50 below the gate metal layer 10 and the holes are accumulated in the semiconductor layer 50 below the gate metal layer 10. Hence, if the voltage applied to the gate metal layer 10 is lower than the voltage applied to the guide layer 30, the electric field between the gate metal layer 10 and the semiconductor layer 50 is reinforced by means of the electric field between the gate metal layer 10 and the guide layer 30. As a result, it is able to easily repel the electrons from the semiconductor layer 50 below the gate metal layer 10 and accumulate the holes in the semiconductor layer 50 below the gate metal layer 10, thereby to reduce the leakage current $I_{off}$ through the effect of the electric field. If the thin film field effect transistor is a P-type transistor, in the off state the holes are repelled from the semiconductor layer 50 below the gate metal layer 10 and the electrons are accumulated in the semiconductor layer 50 below the gate metal layer 10. Hence, if the voltage applied to the gate metal layer 10 is higher than the voltage applied to the guide layer 30, the electric field between the gate metal layer 10 and the semiconductor layer 50 is reinforced by means of the electric field between the gate metal layer 10 and the guide layer 30. As a result, it is able to easily repel the holes from the semiconductor layer 50 below the gate metal layer 10 and accumulate the electrons in the semiconductor layer 50 below the gate metal layer 10, thereby to reduce the leakage current $I_{off}$ through the effect of the electric field.

According to the thin film field effect transistor with the above-mentioned structure, the guide layer is provided, and through the electric field between the guide layer and the gate metal layer when the thin film field effect transistor is in the on state and off state respectively, it is able to reduce the threshold voltage $V_{th}$, increase the current $I_{on}$ when the transistor is turned on and reduce the leakage current $I_{off}$, thereby to affect the current characteristics by improving the structure of the thin film field effect transistor and increase a ratio of the on-state current to the off-state current. The thin film field effect transistor of the present invention may be any one of an MOSFET, an LTPS TFT and an a-Si TFT. For any type of the transistor, it is able to reduce the threshold voltage and the leakage current according to the above-mentioned principle.

In addition, the thin film field effect transistor with the above-mentioned structure may be an N-type or a P-type transistor.

When the thin film field effect transistor is an N-type transistor, the on-state operating voltage for turning on the transistor is a positive voltage, and the off-state operating voltage for turning off the transistor is a negative voltage. In order to turn on the transistor and to easily accumulate the electrons in the semiconductor layer 50 below the gate metal layer 10 and repel the holes from the semiconductor layer 50 below the gate metal layer 10 so as to form the electric field pointing from the gate metal layer 10 toward the guide layer 30, the first voltage applied to the guide layer 30 should be lower than the on-state operating voltage, and preferably between the on-state operating voltage and the off-state operating voltage. In order to turn off the thin film field effect transistor and to easily accumulate holes in the semiconductor layer 50 below the gate metal layer 10 and repel electrons from the semiconductor layer 50 below the gate metal layer 10 so as to form the electric field pointing from the guide layer 30 toward the gate metal layer 10, the second voltage applied to the guide layer 30 should be higher than the off-state operating voltage, and preferably between the on-state operating voltage and the off-state operating voltage.

Preferably, the first voltage is equal to the second voltage, and they are both grounded.

Similarly, when the thin film field effect transistor is a P-type transistor, the on-state operating voltage for turning on the transistor is a negative voltage and the off-state operating voltage for turning off the transistor is a positive voltage. In order to turn on the transistor and to easily accumulate holes in the semiconductor layer 50 below the gate metal layer 10 and repel electrons from the semiconductor layer 50 below the gate metal layer 10, the first voltage applied to the guide layer 30 should be higher than the on-state operating voltage, preferably between the on-state operating voltage and the off-state operating voltage. In order to turn off the transistor and to easily accumulate electrons in the semiconductor layer 50 below the gate metal layer 10 and repel holes from the semiconductor layer 50 below the gate metal layer 10, the second voltage applied to the guide layer 30 should be lower than the off-state operating voltage, preferably between the on-state operating voltage and the off-state operating voltage.

Preferably, the first voltage is equal to the second voltage, and they are both grounded.

The structure according to an embodiment of the present invention will be described hereinafter by taking the thin film field effect transistor being an N-type LTPS TFT as an example.

Figure 3:
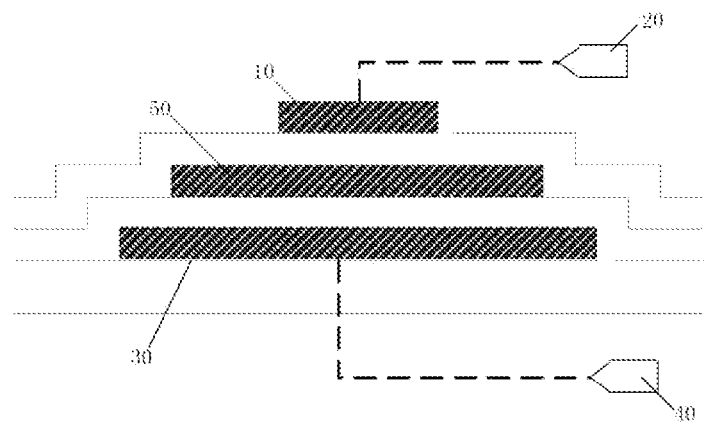
FIG. 3 is a sectional view of the thin film field effect transistor when it is an LTPS transistor.

FIG. 3 is a schematic view showing a sectional view of the LTPS TFT. In this embodiment, the semiconductor layer 50 is arranged between the gate metal layer 10 and the guide layer 30, and the guide layer 30 is formed by a shielding metal layer on a display panel.

Figure 4:
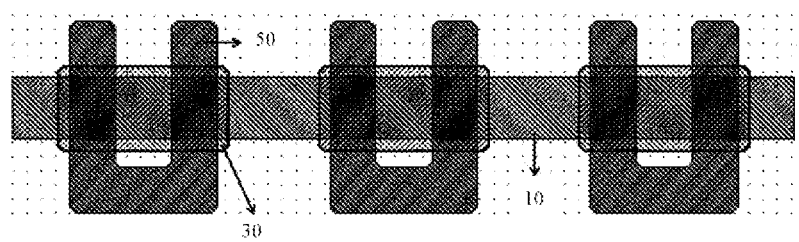
FIG. 4 is a planar view of the thin film field effect transistor when it is an LTPS TFT according to one embodiment of the present invention.
Figure 5:
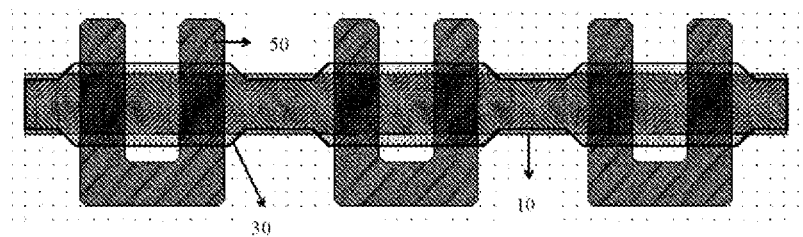
FIG. 5 is a planar view of the thin film field effect transistor when it is an LTPS TFT according to another embodiment of the present invention.

FIG. 4 is a planar view showing the LTPS TFT according to one embodiment of the present invention, and FIG. 5 is a planar view showing the LTPS TFT according to another embodiment of the present invention. In FIG. 4, the guide layers 30 of the LTPS TFTs are arranged separately on the substrate, and thus can be controlled individually. In FIG. 5, the guide layers 30 of the LTPS TFTs are connected to each other on the substrate, and they are connected to a voltage terminal for controlling the voltage applied thereto.

Figure 6:
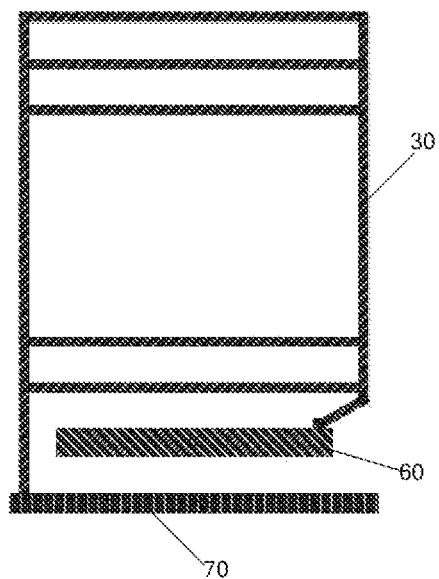
FIG. 6 is a schematic view showing the connection for the structure as shown in FIG. 5.

FIG. 6 is a planar view showing the layout of the LTPS TFT when the structure as shown in FIG. 5 is adopted. The shielding metal layers of the display panel form the guide layers 30 of the N-type LTPS TFTs, and all the guide layers 30 on the substrate are connected to each other and grounded respectively. In this embodiment, the shielding metal layers of the display panel are connected to each other, and connected to a grounded end GND of a driving circuit IC60 of the display panel or to a flexible printing circuit board FPC70. The driving circuit IC60 and the flexible printing circuit board FPC70 are both external voltage supply devices for the display panel, and the flexible printing circuit board FPC70 supplies a signal to the driving circuit IC60.

The working principle of the LTPS TFT with the above-mentioned structure will be described hereinafter by taking an N-type LTPS TFT as an example.

Figure 7:
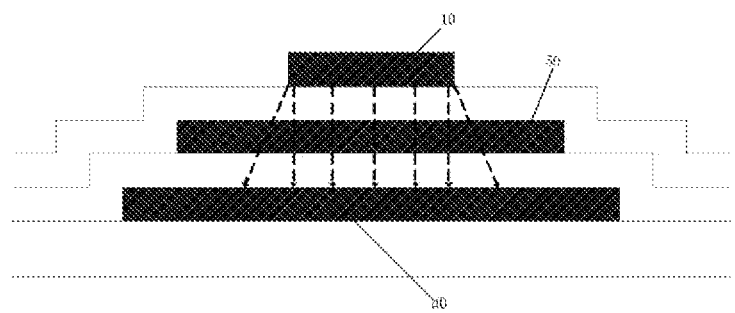
FIG. 7 is a view showing the distribution of an electric field when the thin film field effect transistor is in an on state.

In the on state, the gate metal layer 10 is connected to a positive potential, and the guide layer 30, i.e., the shielding metal layer, is connected to the grounded end GND. The electric field formed between the gate metal layer 10 and the semiconductor layer 50 is in a direction as shown in FIG. 7, and the direction is the same as that of the electric field formed between the gate metal layer 10 and the guide layer 30, i.e., it points from the gate metal layer 10 toward the guide layer 30 (both in the vertical and oblique directions). According to the principle that the movement direction of the electrons is opposite to the electric field direction, as compared with the prior art, the additional electric field pointing from the gate metal layer 10 toward the guide layer 30 as shown in FIG. 7 enables the electrons to be more easily accumulated in the semiconductor layer 50 below the gate metal layer 10, thereby it is able to reduce the threshold voltage $V_{th}$ and increase the on-state current $I_{on}$.

Figure 8:
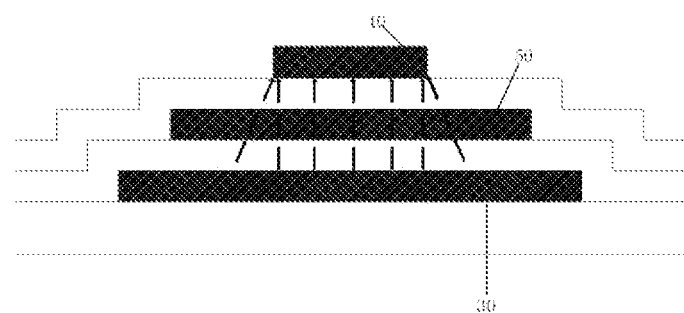
FIG. 8 is a view showing the distribution of an electric field when the thin film field effect transistor is in an off state.

In the off state, the gate metal layer 10 is connected to a negative potential, and the guide layer 30, i.e., the shielding metal layer, is connected to the grounded end GND. The electric field formed between the gate metal layer 10 and the semiconductor layer 50 is in a direction as shown in FIG. 8, and the direction is the same as that of the electric field formed between the gate metal layer 10 and the guide layer 30, i.e., it points from the guide layer 30 toward the gate metal layer 10 (both in vertical and oblique directions). According to the principle that the movement direction of the electrons is opposite to the electric field direction, as compared with the prior art, the additional electric field pointing from the guide layer 30 toward the gate metal layer 10 enables the electrons to be more difficultly accumulated below the gate metal layer 10 while the holes to be more easily accumulated below the gate metal layer 10, thereby it is able to reduce the off-state current $I_{off}$ through the effect of the electric field.

The above description is given on the basis of the structure of the N-type LTPS TFT and its working principle. Similarly, a P-type LTPS TFT may also be used, the structure and the working principle of which will not be described in detail herein. It should be appreciated that, for the P-type LTPS TFT, the effect of the electric field formed between the shielding metal layer and the gate metal layer is similar to that for the N-type LTPS TFT. In the on state, the gate metal layer attracts the holes due to the effect of the electric field and it is more easily to form the holes below the gate metal layer, thereby it is able to reduce the threshold voltage $V_{th}$ and increase the on-state current $I_{on}$. While in the off state, the gate metal layer repels the holes and attracts the electrons due to the effect of the electric field, thereby it is able to reduce the off-state current $I_{off}$. As a result, it is able to increase the ratio of the on-state current to the off-state current for the LTPS TFT.

In addition, in this embodiment, the shielding metal layer is formed as the guide layer and connected to the grounded end GND. As compared with the shielding metal layer that is free and not connected to a potential, this shield metal layer is less susceptible to an external potential such as charge accumulation, and more helpful for anti-electrostatic discharge (ESD) and anti-electromagnetic interference (EMI).

According to one embodiment of the present invention, the shielding metal layers for shielding the thin film field effect transistor are connected to each other and to the grounded end GND of the IC or FPC. As a result, it is able to reduce the threshold voltage $V_{th}$, increase the on-state current $I_{on}$ and reduce the off-state current $I_{off}$ by means of the electric field between the shielding metal layer and the gate metal layer of the thin film field effect transistor, thereby to increase the ratio of the on-state current to the off-state current. In addition, the shielding metal layers, which form a ring, are grounded, and as a result it is able to improve the anti-ESD and anti-EMI performances. Of course, other than materials and processes for the guide layer 30, the materials and processes in the prior art may also be used, and they will not be repeated herein.

The present invention further provides an array substrate on which the above-mentioned thin film field effect transistor is arranged. For example, when the thin film field effect transistor is used as a switch element for a pixel unit of the array substrate, the source metal layer 60 or drain metal layer 70 of the transistor may be connected to a pixel electrode of the pixel unit.

The array substrate comprises a shielding metal layer which forms the guide layer of the thin film field effect transistor.

Further, the shielding metal layer of the array substrate is grounded. In addition, an embodiment of the present invention further provides a display device on which the above-mentioned array substrate is provided. The above-mentioned thin film field effect transistor is arranged on the array substrate of the display device. The display device may be a liquid crystal panel, an electronic paper, an OLED panel, a mobile phone, a tablet PC, a TV, a display, a laptop PC, a digital photo frame, a navigator or any other products or devices having a display function.

The structure of the thin film field effect transistor is mentioned above and will not be repeated herein.

Preferably, when the thin film field effect transistor is an N-type transistor, the shielding metal layers on the display panel form the guide layers, and these shielding metal layers are connected to each other and grounded. Through such a structure, it is able to reduce the threshold voltage $V_{th}$, increase the on-state current $I_{on}$, reduce the off-state current $I_{off}$, thereby to increase the ratio of the on-state current to the off-state current. Also, it is able to improve the anti-ESD and anti-EMI performances.

An embodiment of the present invention further provides a method for driving the above-mentioned thin film field effect transistor, comprising: when an on-state operating voltage or off-state operating voltage is applied to the gate metal layer to form an electric field between the gate metal layer and the semiconductor layer, applying a predetermined voltage to the guide layer, such that an electric field is also formed between the guide layer and the gate metal layer, the semiconductor layer accumulates electrons or holes to reinforce the electric field between the gate metal layer and the semiconductor layer by utilizing the electric field between the guide layer and the gate metal layer.

Further, the on-state operating voltage is applied to the gate metal layer, and the first voltage is applied to the guide layer, so as to establish an electrical connection between the source metal layer and the drain metal layer, i.e., at this time the predetermined voltage is the first voltage.

The off-state operating voltage is applied to the gate metal layer, and the second voltage is applied to the guide layer, so as to cut off the electrical connection between the source metal layer and the drain metal layer, i.e., at this time, the predetermined voltage is the second voltage.

When the thin film field effect transistor is an N-type transistor, the on-state operating voltage is a positive voltage and the off-state operating voltage is a negative voltage. Either of the first voltage and the second voltage is of a value between the on-state operating voltage and the off-state operating voltage.

When the thin film field effect transistor is a P-type transistor, the on-state operating voltage is a negative voltage and the off-state operating voltage is a positive voltage. Either of the first voltage and the second voltage is of a value between the on-state operating voltage and the off-state operating voltage.

Preferably, the first voltage is equal to the second voltage, and they are both zero. In other words, the predetermined voltage is zero.

An embodiment of the present invention further provides an electronic product comprising the above-mentioned display device. The structure of the display device is mentioned above, and will not be repeated herein.

According to the thin film field effect transistor, driving method thereof, the array substrate, the display device and the electronic product of an embodiment of the present invention, the guide layer is provided, and through the electric field between the guide layer and the gate metal layer when the thin film field effect transistor is in the on state and off state respectively, it is able to reduce the threshold voltage $V_{th}$, increase the current $I_{on}$ when the transistor is turned on and reduce the leakage current $I_{off}$, thereby to affect the current characteristics by improving the structure of the thin film field effect transistor and increase a ratio of the on-state current to the off-state current.

The above are merely the preferred embodiments of the present invention. A person skilled in the art may make further modifications and improvements without departing from the spirit and principle of the present invention, and these modifications and improvements shall also be considered as the protection scope of the present invention.

What is claimed is:

1. A thin film field effect transistor, comprising a gate metal layer and a semiconductor layer,
   wherein the thin film field effect transistor further comprises a guide layer,
   wherein when an electric field is formed between the gate metal layer and the semiconductor layer, an electric field is also formed between the guide layer and the gate metal layer, the semiconductor layer accumulates electrons or holes to reinforce the electric field between the gate metal layer and the semiconductor layer by utilizing the electric field between the guide layer and the gate metal layer,
   wherein a projection area of the guide layer on a substrate where the thin film field effect transistor is arranged is larger than that of the semiconductor layer, and the projection area of the semiconductor layer on the substrate is larger than that of the gate metal layer, so as to increase an overlapping area between the projection area of the guide layer on the substrate and the projection area of the semiconductor layer on the substrate, and
   wherein the guide layer is not in contact with the gate metal layer and wherein the guide layer is disposed over the substrate, the semiconductor layer is disposed over the guide layer, and the gate metal layer is disposed over the semiconductor layer.

2. The thin film field effect transistor according to claim 1, wherein the electric field between the gate metal layer and the guide layer is in a direction identical to the electric field between the gate metal layer and the semiconductor layer.

3. The thin film field effect transistor according to claim 2, wherein when an on-state operating voltage is applied to the gate metal layer, a first voltage is applied to the guide layer, and the electric field between the gate metal layer and the guide layer is in a direction identical to the electric field between the gate metal layer and the semiconductor layer, and
   when an off-state operating voltage is applied to the gate metal layer, a second voltage is applied to the guide layer, and the electric field between the gate metal layer and the guide layer is in a direction identical to the electric field between the gate metal layer and the semiconductor layer.

4. The thin film field effect transistor according to claim 3, wherein the thin film field effect transistor is an N-type transistor, the on-state operating voltage is a positive voltage, the off-state operating voltage is a negative voltage, and either of the first voltage and the second voltage is of a value between the on-state operating voltage and the off-state operating voltage.

5. The thin film field effect transistor according to claim 3, wherein the thin film field effect transistor is a P-type transistor, the on-state operating voltage is a negative voltage, the off-state operating voltage is a positive voltage, and either of the first voltage and the second voltage is of a value between the on-state operating voltage and the off-state operating voltage.

6. The thin film field effect transistor according to claim 4, wherein the first voltage is equal to the second voltage, and the first voltage and the second voltage are both zero.

7. The thin film field effect transistor according to claim 1, wherein the semiconductor layer is provided between the gate metal layer and the guide layer.

8. The thin film field effect transistor according to claim 7, wherein a first insulating layer is provided between the semiconductor layer and the gate metal layer, and a second insulating layer is provided between the semiconductor layer and the guide layer.

9. The thin film field effect transistor according to claim 1, wherein the guide layer is made of a conductive material.

10. An array substrate on which the thin film field effect transistor according to claim 1 is provided.

11. The array substrate according to claim 10, wherein the array substrate comprises a shielding metal layer formed as a guide layer.

12. The array substrate according to claim 11, wherein the shielding metal layer is grounded.

13. A display device comprising the array substrate according to claim 10.

14. The thin film field effect transistor according to claim 5, wherein the first voltage is equal to the second voltage, and the first voltage and the second voltage are both zero.

15. A thin film field effect transistor comprising:
   a gate metal layer having a first cross section area;
   a semiconductor layer having a second cross section area, with the second cross section area being larger than the first cross section area; and
   a guide layer having a third cross section area, with the third cross section area being larger than the second cross section area,
   wherein when an electric field is formed between the gate metal layer and the semiconductor layer, an electric field is also formed between the guide layer and the gate metal layer, the semiconductor layer accumulates electrons or holes to reinforce the electric field between the gate metal layer and the semiconductor layer by utilizing the electric field between the guide layer and the gate metal layer, wherein a projection area of the guide layer on a substrate where the thin film field effect transistor is arranged is larger than that of the semiconductor layer and the projection area of the semiconductor layer on the substrate is larger than that of the gate metal layer, so as to increase an overlapping area between the projection area of the guide layer on the substrate and the projection area of the semiconductor layer on the substrate, and wherein the guide layer is not in contact with the gate metal layer and wherein the guide layer is disposed over the substrate, the semiconductor layer is disposed over the guide layer, and the gate metal layer is disposed over the semiconductor layer.

16. The thin film field effect transistor according to claim 2, wherein the gate metal layer has a first cross section area, the semiconductor layer has a second cross section area, and the guide layer has a third cross section area, the second cross section area being larger than the first cross section area and the third cross section area being larger than the second cross section area.

17. The thin film field effect transistor according to claim 15, wherein the guide layer is disposed between the substrate layer and the semiconductor layer, and the semiconductor layer is disposed between the guide layer and the gate metal layer.

* * * * *